(12) United States Patent
Lee

(10) Patent No.: US 6,372,667 B1
(45) Date of Patent: Apr. 16, 2002

(54) METHOD OF MANUFACTURING A CAPACITOR FOR SEMICONDUCTOR MEMORY DEVICES

(75) Inventor: Kee Jeung Lee, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/602,780

(22) Filed: Jun. 23, 2000

(30) Foreign Application Priority Data

Jun. 25, 1999 (KR) ............................................ 99-24217

(51) Int. Cl.⁷ ........................ H01L 21/31; H01L 21/469
(52) U.S. Cl. ...................... 438/785; 438/758; 438/778; 438/786; 438/774; 438/381
(58) Field of Search ................................. 438/381, 785, 438/778, 786, 758, 788, 774

(56) References Cited

U.S. PATENT DOCUMENTS

| | | |
|---|---|---|
| 4,130,694 A | 12/1978 | Glass et al. |
| 5,256,455 A * | 10/1993 | Numasawa ................. 427/255 |
| 5,292,673 A * | 3/1994 | Shinriki et al. |
| 5,312,783 A * | 5/1994 | Takasaki et al. |
| 5,452,178 A | 9/1995 | Emesh et al. |
| 5,631,188 A | 5/1997 | Chang et al. |
| 5,741,721 A | 4/1998 | Stevens |
| 5,753,945 A | 5/1998 | Chivukula et al. |
| 5,763,300 A | 6/1998 | Park et al. |
| 5,776,660 A | 7/1998 | Hakey et al. |
| 5,837,576 A | 11/1998 | Chen et al. |
| 5,859,760 A | 1/1999 | Park et al. |
| 5,872,415 A | 2/1999 | Dreifus et al. |
| 5,910,880 A | 6/1999 | DeBoer et al. |
| 5,936,831 A | 8/1999 | Kola et al. |
| 5,980,977 A | 11/1999 | Deng et al. |
| 6,180,542 B1 * | 1/2001 | Hwang ........................ 438/785 |
| 6,201,276 B1 * | 3/2001 | Agarwal et al. ............. 257/315 |

FOREIGN PATENT DOCUMENTS

| | | | |
|---|---|---|---|
| JP | 62136035 | 6/1987 | |
| JP | 63038248 | 2/1988 | |
| JP | 01173622 | 7/1989 | |
| JP | 401227466 A * | 9/1989 | ........... H01L/27/04 |
| JP | 02226754 | 9/1990 | |
| JP | 05167008 | 7/1993 | |
| JP | 05335483 | 12/1993 | |
| JP | 06163819 | 6/1994 | |
| JP | 07014993 | 1/1995 | |
| JP | 07045467 | 2/1995 | |
| JP | 11191612 | 7/1999 | |
| JP | 11233723 | 8/1999 | |

* cited by examiner

*Primary Examiner*—Matthew Smith
*Assistant Examiner*—V. Yevsikov
(74) *Attorney, Agent, or Firm*—Pillsbury Winthrop LLP

(57) ABSTRACT

A method of manufacturing a capacitor for semiconductor memory devices is disclosed. According to the present invention, a lower electrode is formed on the semiconductor substrate. A $Ta_2O_5$ layer with a tantalum-based carbon-free precursor is formed on the lower electrode. And, an upper electrode is formed on the $Ta_2O_5$ layer.

5 Claims, 2 Drawing Sheets

METHOD OF MANUFACTURING A CAPACITOR FOR SEMICONDUCTOR MEMORY DEVICES

FIELD OF THE INVENTION

The present invention relates to a method of fabricating a capacitor for semiconductor memory devices, more particularly to a method of fabricating a capacitor for semiconductor memory devices employing a $Ta_2O_5$ layer as a dielectric layer.

BACKGROUND OF THE INVENTION

As the number of memory cells for consisting DRAM semiconductor device has been increased recently, occupation dimension of the memory cells is gradually decreased. Meanwhile, capacitors formed in the respective memory cells require a sufficient capacitance for precise reading out of storage data. Accordingly, capacitors in the current DRAM semiconductor devices are required to occupy small dimension as well as to provide a greater capacitance. The capacitance of a capacitor can be increased by using an insulator of high dielectric constant as a dielectric layer, or by enlarging the dimension of a lower electrode. In a highly integrated DRAM semiconductor device, $Ta_2O_5$ having a higher dielectric constant than that of the nitride-oxide(NO) is presently used as a dielectric, thereby forming the lower electrode a 3-Dimentional structure.

FIG. 1 is a cross-sectional view for showing a capacitor for conventional semiconductor memory devices. Referring to FIG. 1, a gate electrode 13 including a gate insulating layer 12 at a lower portion thereof is formed according to a known technique on a semiconductor substrate 10 in which a field oxide layer 11 is formed at a selected portion. A junction region 14 is formed on the semiconductor substrate 10 of both sides of the gate electrode 13 thereby forming an MOS transistor. A first interlevel insulating layer 16 and a second interlevel insulating layer 18 are formed on the semiconductor substrate 10 in which the MOS transistor is formed. A storage node contact hole h is formed inside the first and the second interlevel insulating layers 16, 18 so that the junction region 14 is exposed. A cylinder type lower electrode 20 is formed according to a known method, inside the storage node contact hole h so as to be in contact with the exposed junction region 14. A HSG(hemi-spherical grain) layer 21 is formed on a surface of the lower electrode 20 so as to more increase surface dimension of the lower electrode 20. A surface of the lower electrode 20 including the HSG layer 21 is cleaned. A $Ta_2O_5$ layer 23 is deposited on an upper portion of the lower electrode 20 and on the second interlevel insulating layer 18. The $Ta_2O_5$ layer 23 can be formed by the CVD(chemical vapor deposition) method due to a reaction between a tantalum containing precursor and $O_2$. At this time, as for the conventional precursors, there have been used $Ta(OC_2H_5)$ [tantalum pentaethoxide], $TaCl_2(OC_2H_5)_2C_5H_7O_2$[dichloro-diethoxy-acetylacetonate], $Ta(N(CH_3)_2)_5$[penta-dimethyl-amino-tantalum], $Ta(DMP)_4Cl$[tantalum chloro-tetradipivaloymethane], and $Ta(OCH_3)_5$[tantalum pentamethoxide]. Afterward, the $Ta_2O_5$ layer 23 in the amorphous state is became the crystalline state by a predetermined thermal process. Then, an upper electrode 25 is formed on the $Ta_2O_5$ layer 23 according to a known method.

However, since the conventional $Ta_2O_5$ layer is formed by the reaction between the precursor having carbon components and oxygen, there are remained reaction by-products such as carbon atoms, carbon compounds (C, $CH_4$, $C_2H_4$) and $H_2O$ in the $Ta_2O_5$ layer. Those reaction by-products incur leakage current and degrade the dielectric strength of the $Ta_2O_5$ layer.

In the conventional method, thermal processes at low and high temperatures are performed to remove those reaction by-products after the $Ta_2O_5$ layer is formed.

The thermal processes of low and high temperatures can remove the by-products, however this method increases manufacturing steps.

SUMMARY OF THE INVENTION

Accordingly, object of the present invention is to provide a method of manufacturing a capacitor for semiconductor memory devices capable of lowering leakage current, obtaining great capacitance and reducing manufacturing steps.

To accomplish the foregoing object, the method according to an embodiment of the present invention includes the steps of: forming a lower electrode on the semiconductor substrate; forming a $Ta_2O_5$ layer with a tantalum-based carbon-free precursor on the lower electrode; and forming an upper electrode on the $Ta_2O_5$ layer.

According to another embodiment of the present invention, the method includes the steps of: forming a lower electrode on the semiconductor substrate; forming a $Ta_2O_5$ layer with $TaF_5$ solid source as a precursor on the lower electrode; and forming an upper electrode on the $Ta_2O_5$ layer.

According to still another embodiment of the present invention, the method includes the steps of: forming a lower electrode on the semiconductor substrate; forming a $Ta_2O_5$ layer with $TaCl_5$ solid source as a precursor on the lower electrode; and forming an upper electrode on the $Ta_2O_5$ layer.

Herein, the $Ta_2O_5$ layer is formed by vaporizing the precursor and injecting into a chamber for generating the $Ta_2O_5$ layer, and simultaneously injecting hydrogen and oxygen gases and reacting according to a chemical vapor reaction of the vaporized precursor, hydrogen gas and oxygen gas.

DETAILED DESCRIPTION OF THE PREFERRED EMBODIMENTS

Embodiment 1

Figure 1:
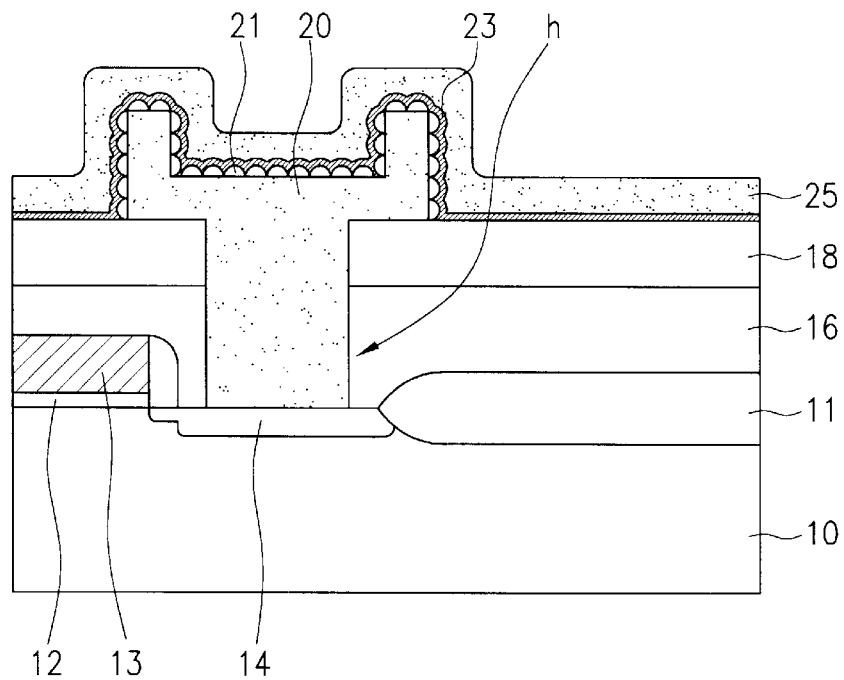
FIG. 1 is a cross-sectional view of a capacitor for conventional semiconductor memory devices.
Figure 2A:
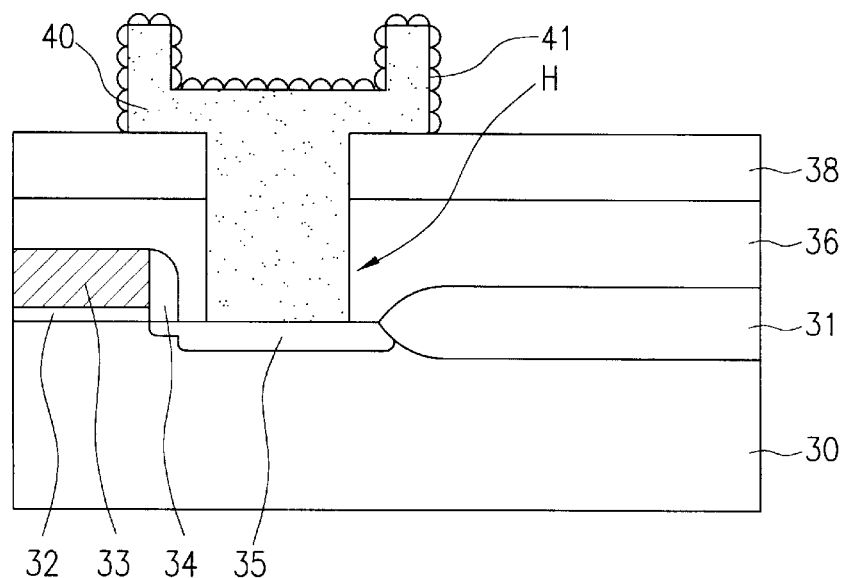
FIGS. 2A to 2C are cross-sectional views for illustrating a capacitor for semiconductor memory devices according to one embodiment of the present invention.
Figure 2B:
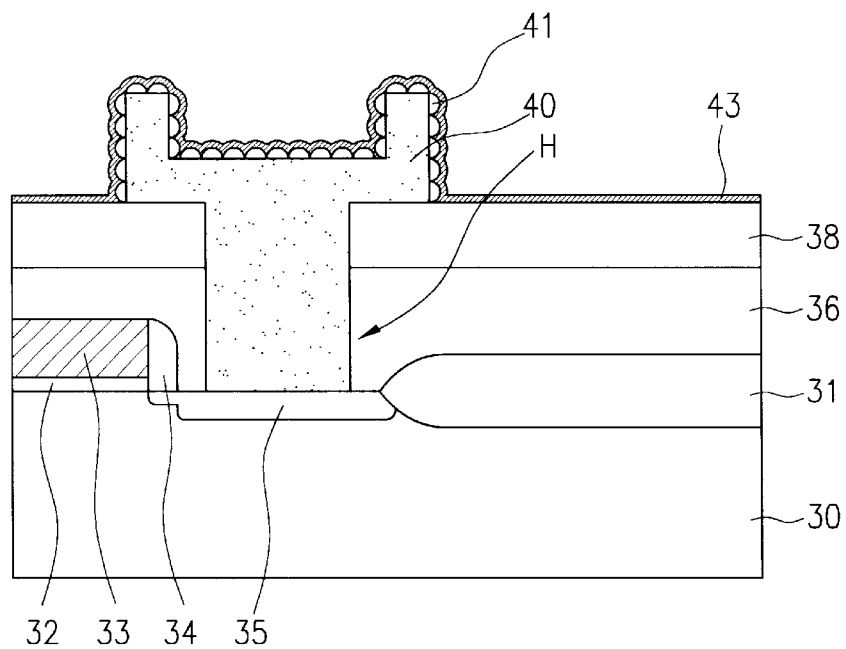

Referring to FIG. 2A, a field oxide layer 31 is formed on a semiconductor substrate 30 having a selected conductivity by a known method. A gate electrode 33 including a gate insulating layer 32 at a lower portion thereof is formed at an upper portion of the semiconductor substrate 30, and spacers 34 are formed at both side-walls of the gate electrode 33. A junction regions 35 is formed at both edges of the gate electrode 33, thereby forming an MOS transistor. A first interlevel insulating layer 36 and a second interlevel insulating layer 38 are formed at the semiconductor substrate 30 in which the MOS transistor is formed. Afterward, the second and the first interlevel insulating layers 38, 36 are patterned to expose one portion of the junction region 35, thereby forming a storage node contact hole H. A lower electrode 40 is formed as a cylinder structure to be in contact with the exposed junction region 35. At this time, the lower electrode 40 can be formed as a stacking structure. The HSG layer 41 is formed on a surface of the lower electrode 40 to extend the surface area of the lower electrode 40 by a known method.

Afterward, the lower electrode 40 including the HSG layer 41 and the second interlevel insulating layer 38 are surface-treated to prevent generating of a low dielectric natural oxide layer at an interface of the lower electrode 40 including the HSG layer 41 and a dielectric layer(not shown) to be formed later. Herein, the surface-treatment can be performed in various methods. One of the method, a surface-treatment method is to perform the rapid thermal nitridation process at temperature of 650~950° C. in a chamber of $NH_3$ gas atmosphere. Also, another surface-treatment method is to clean the surface of the lower electrode by HF vapor, HF solution or a HF containing compound. Herein, before or after the cleaning process, a surface-treatment can be further performed by $NH_4OH$ solution or $H_2SO_4$ solution. In addition, structural defects caused by dangling bonds on the lower electrode 40 and structural disunity can be improved by performing under $N_2O$ or $O_2$ gas atmosphere. As a result, the generation of the natural oxide layer is prevented. At this time, when the rapid thermal nitridation method is performed, a barrier of silicon nitride layer(not shown) can be formed on the lower electrode 40 including the HSG layer 41 and on the second interlevel insulating layer 38.

Referring to 2B, a $Ta_2O_5$ layer 43 as a dielectric is formed on the lower electrode 40 including the HSG layer 41 and on the second interlevel insulating layer 38. In the present invention, a carbon-free $TaF_5$ solid source is used as a precursor to form the $Ta_2O_5$ layer 43. At this time, the $Ta_2O_5$ layer 43 is obtained from the following equations.

$$5H_2 + 2TaF_5 \rightarrow 10HF + 2Ta \quad \text{(chemical formula 1)}$$

$$4Ta + 5O_2 \rightarrow 2Ta_2O_5 \quad \text{(chemical formula 2)}$$

That is, the $TaF_5$ solid source is vaporized by a bubbler maintained at temperature of 65~95° C., and then became into the gas state. The $TaF_5$ gas is supplied into a CVD chamber provided with a wafer to which the $Ta_2O_5$ layer is deposited, through a conduit coupled to the chamber. Herein, the temperature of the conduit coupled to the chamber is preferably maintained in the range of 100~150° C. to prevent $TaF_5$ gas condensation, and the temperature inside the chamber is kept below 200° C. with pressure of 0.1~10 mTorr. Hydrogen gas and oxygen gas are supplied into the CVD chamber to which the $TaF_5$ gas is supplied. Herein, the $TaF_5$ gas is supplied by dose of approximately 250~350 sccm, and oxygen gas is supplied by dose of 150~250 sccm. Then, the $TaF_5$ gas is reacted with hydrogen gas $H_2$, thereby generating HF gas and Ta gas as shown in the chemical formula 1. Here, since the HF gas as known in the art is a gas of strong volatility, HF gas is all volatilized and Ta gas is only remained. The Ta gas obtained from the chemical formula 1 is reacted again with oxygen gas $O_2$ supplied into the CVD chamber, thereby forming the $Ta_2O_5$ layer. Herein, to more accelerate reactivity of the hydrogen gas and the oxygen gas supplied into the CVD chamber, it is preferable to use active hydrogen and oxygen ionized by a glow plasma discharging method. The active hydrogen gas and the active oxygen gas are injected into the CVD chamber by a remote plasma method. The remote plasma method as known in the art can be described as follows. Hydrogen and oxygen are injected into a plasma generator disposed outside a corresponding chamber, for example the CVD chamber, and then activated, afterward the active hydrogen and oxygen are injected into the CVD chamber. Since the active hydrogen and the active oxygen are injected into the CVD chamber by the remote plasma method, no plasma damage at the $Ta_2O_5$ layer is occurred. The $Ta_2O_5$ layer 43 is formed at a low temperature of below 200° C., therefore over oxidation is not occurred. Accordingly, the low dielectric oxide layer formed at the interface of the lower electrode 40 and the $Ta_2O_5$ layer 43 is formed with thickness of below 10 Å. Compared to the interfacial low dielectric oxide layer having thickness of 30 Å formed during the conventional $Ta_2O_5$ layer is formed, thickness of the low dielectric oxide layer can largely be reduced. Further, although the $Ta_2O_5$ layer 43 is in the amorphous state, its dielectric constant $\in$ is 25 that is a greater value than the dielectric constant($\in$= 17–20) of the conventional $Ta_2O_5$ layer made of an organic metal compound including carbon components as a precursor. Therefore, a thermal process to crystallize the amorphous $Ta_2O_5$ layer 43 is omissible. In addition, the $Ta_2O_5$ layer 43 of the present invention does not include reaction by-products remained therein such as carbon components, compounds containing carbon components, and moisture. As a result, there is no need to perform low and high thermal processes for out-diffusing carbon components, compounds containing carbon components and moisture. Manufacturing steps are greatly reduced.

Figure 2C:
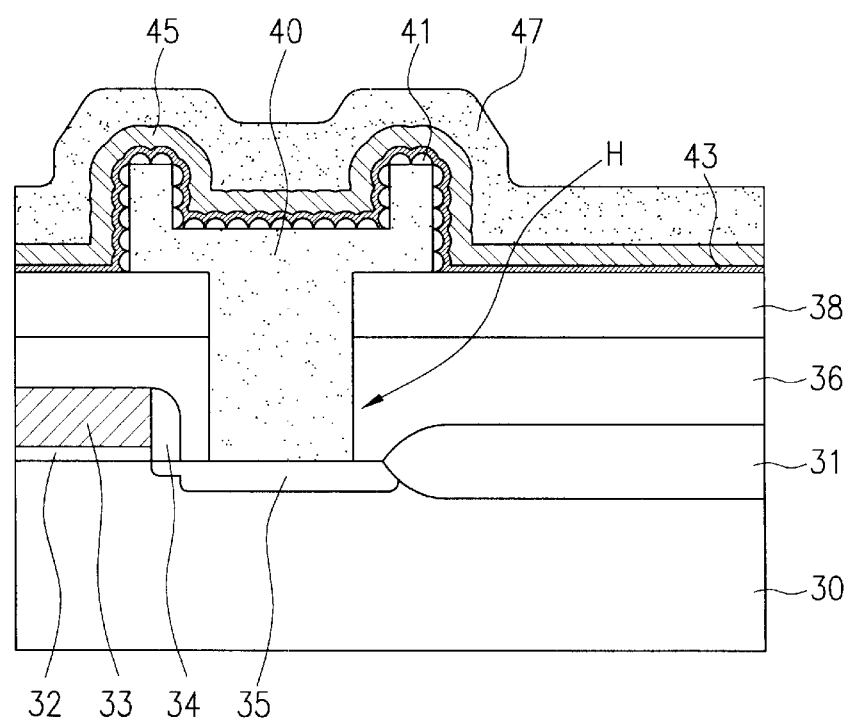

Afterward, as shown in FIG. 2C, an upper electrode 45 is formed on the $Ta_2O_5$ layer 43. The upper electrode 45 can be made of a layer selected from metal layers of TiN, TaN, W, WN, WSi, Ru, $RuO_2$, Ir, $IrO_2$ or Pt. Further, to prevent degradation of electric property of the capacitor, a buffer layer 47 is formed on the upper electrode 45. At this time, the buffer layer 47 can be made of a polysilicon layer. Additionally, the upper electrode 45 can be made of a doped polysilicon layer.

Embodiment 2

A manufacturing process of a capacitor similar to that of the first embodiment is applied in the second embodiment, however the step of forming the $Ta_2O_5$ layer is only different therefrom.

The $Ta_2O_5$ layer in the present embodiment employs a $TiCl_4$ solid source as a precursor. At this time, the $Ta_2O_5$ layer is obtained from the following equations.

$$5H_2 + 2TaCl_5 \rightarrow 5HCl + 2Ta \quad \text{(chemical formula 3)}$$

$$4Ta + 5O_2 \rightarrow 2Ta_2O_5 \quad \text{(chemical formula 4)}$$

That is, the $TaCl_5$ solid source is vaporized by a bubbler maintained at temperature of 95~1,505° C., and then became into the gas state. At this time, instead the bubbler, the $TaCl_5$ solid source can be vaporized by a fixed temperature vaporizing apparatus including a vaporizer having pressure below 760 mTorr and a conduit. The fixed temperature vaporizing apparatus is preferably controlled such that the vaporized steam is injected in the smog state. The $TaCl_5$ solid source generated as above is supplied through the conduit to the CVD chamber provided with a wafer to which the $Ta_2O_5$ layer is deposited. Herein, temperature of the conduit is preferably maintained at 100~150° C., and temperature in the chamber is preferably maintained below 200° C. with pressure of 0.1~10 mtorr. Similar to the first embodiment, active hydrogen gas and active oxygen gas are supplied to the CVD chamber to which the $TaCl_5$ gas is supplied. Then, as shown in the chemical formula, the $TaCl_5$ gas is reacted with hydrogen gas $H_2$, thereby generating HCl gas and Ta gas. At this time, the HCl gas also has strong volatility as known in the art, therefore all of the HCl gas is volatized, and Ta gas is only remained. The Ta gas as obtained from the chemical formula 3 is reacted again with the oxygen gas $O_2$ supplied into the CVD chamber, thereby generating the $Ta_2O_5$ layer as shown in the chemical formula 4. The active hydrogen and oxygen gases are injected into the CVD chamber according to the remote plasma method similar to the first embodiment. Subsequent steps are all equal to those of the first embodiment.

As described above in detail, when the $Ta_2O_5$ layer is made of the carbon-free precursor, reaction by-products remained therein such as carbon components, compounds containing carbon components, and moisture are not remained therein. As a result, leakage current is also reduced. Moreover, since moving ions such as $F^-$, $Cl^-$ degrading intensity of the $Ta_2O_5$ layer are all volatized, the $Ta_2O_5$ layer is formed in clean condition. Accordingly, the breakdown voltage is raised thereby improving the electric property of capacitor.

Further, the $Ta_2O_5$ layer is formed at a low temperature of below 200° C., therefore over oxidation is not occurred. Accordingly, the low dielectric oxide layer formed at the interface of the lower electrode and the $Ta_2O_5$ layer is formed with thickness of below 10 Å. Effective thickness of the dielectric layer is reduced.

Moreover, although the $Ta_2O_5$ layer is in the amorphous state, the dielectric constant $\in$ is greater than the dielectric constant ($\in=17-20$) of the conventional $Ta_2O_5$ layer formed with an organic metal compound including carbon components as a precursor. Therefore, a thermal process to crystallize the amorphous $Ta_2O_5$ layer is omissible. In addition, the step for out-diffusing the carbon components, compounds containing carbon components and moisture in the layer is excludable. Manufacturing steps are greatly reduced.

Various other modifications will be apparent to and can be readily made by those skilled in the art without departing from the scope and spirit of the present invention.

What is claimed is:

1. A method of manufacturing a capacitor on a semiconductor substrate comprising the steps of:

forming a lower electrode on the semiconductor substrate;

forming a $Ta_2O_5$ layer with $TaF_5$ solid source as a precursor on the lower electrode; and forming an upper electrode on the $Ta_2O_5$ layer;

wherein the $Ta_2O_5$ layer is formed by a chemical vapor reaction of a vaporized $TaF_5$, hydrogen gas and oxygen gas.

2. The method of claim 1, wherein the $TaF_5$ solid source is vaporized by a bubbler maintained at a fixed temperature of 65~95° C., and then supplied into a CVD chamber through a conduit coupled to the chamber maintained in the temperature range of 100~150° C.

3. The method of claim 2, wherein the hydrogen gas and the oxygen gas are activated by a remote plasma method.

4. The method of claim 1, wherein the $Ta_2O_5$ layer is formed at temperature below 200° C. with pressure of 0.1~10 mTorr.

5. The method of claim 1, further comprising between the steps of forming the lower electrode and the $Ta_2O_5$ layer, a step of surface-treating to prevent gene rating a natural oxide layer on a surface of the lower electrode.

* * * * *